United States Patent
Casey et al.

(10) Patent No.: US 10,134,793 B1
(45) Date of Patent: Nov. 20, 2018

(54) METHOD OF FORMING TWO-DIMENSIONAL AND THREE-DIMENSIONAL SEMICONDUCTOR CHIP ARRAYS

(71) Applicant: Xerox Corporation, Norwalk, CT (US)

(72) Inventors: Joseph F. Casey, Webster, NY (US); Gary D. Redding, Victor, NY (US); Craig Alan Zufelt, Macedon, NY (US); Michael B. Monahan, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 15/596,292

(22) Filed: May 16, 2017

(51) Int. Cl.
 *H04L 23/02* (2006.01)
 *H01L 27/146* (2006.01)
 *H01L 23/544* (2006.01)

(52) U.S. Cl.
 CPC ...... *H01L 27/14632* (2013.01); *H01L 23/544* (2013.01); *H01L 27/1469* (2013.01); *H01L 27/14634* (2013.01); *H01L 2223/54426* (2013.01)

(58) Field of Classification Search
 CPC ......... H01L 27/14643; H01L 27/14687; H01L 27/14632; H01L 23/544
 USPC .......................................................... 257/680
 See application file for complete search history.

(56) References Cited

U.S. PATENT DOCUMENTS 5,753,959 A * 5/1998 Quinn ..................... B41J 2/155
257/443
8,809,088 B2 * 8/2014 Shen .................. H01L 27/14636
438/27

\* cited by examiner

*Primary Examiner* — Theresa T Doan
(74) *Attorney, Agent, or Firm* — Simpson & Simpson, PLLC

(57) ABSTRACT

A sensor chip formed from a plurality of sensor chips fabricated on a wafer, the wafer including a top surface, a bottom surface opposite the top surface and a thickness between the top and bottom surfaces, the sensor chip including an active area formed on the top surface, a first sacrificial edge including a first fiducial and a second fiducial, and a first score line formed in a first portion of the thickness on the top surface between the first sacrificial edge and the active area.

10 Claims, 10 Drawing Sheets

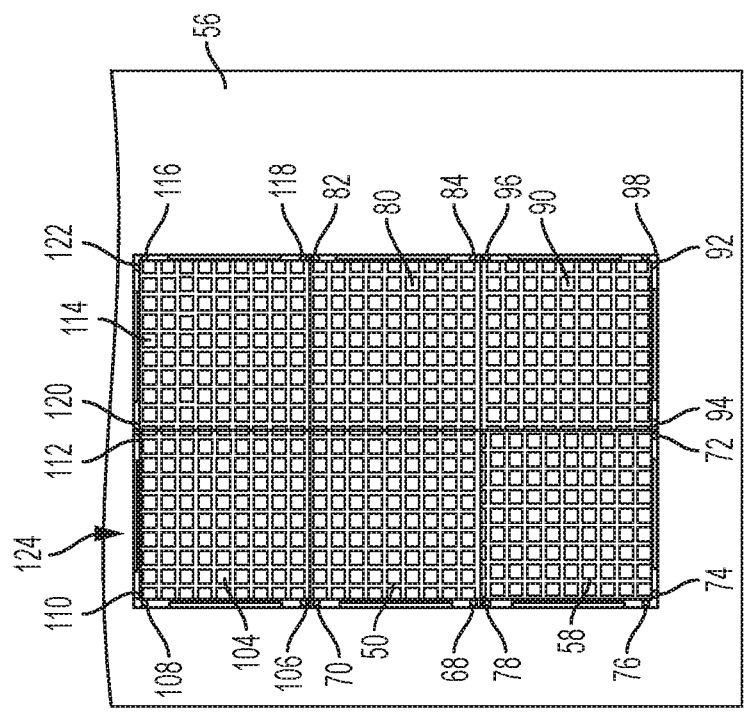
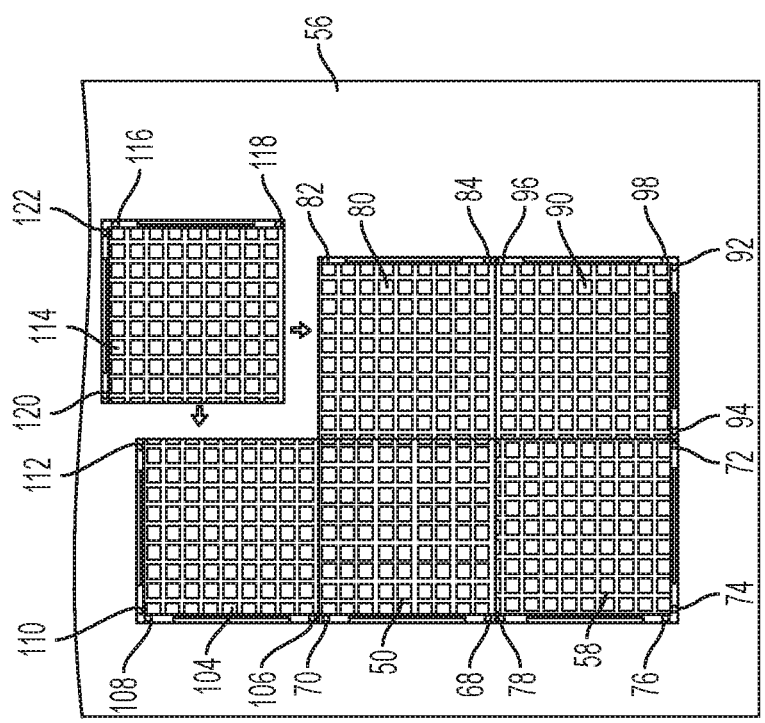
FIG. 10
FIG. 11

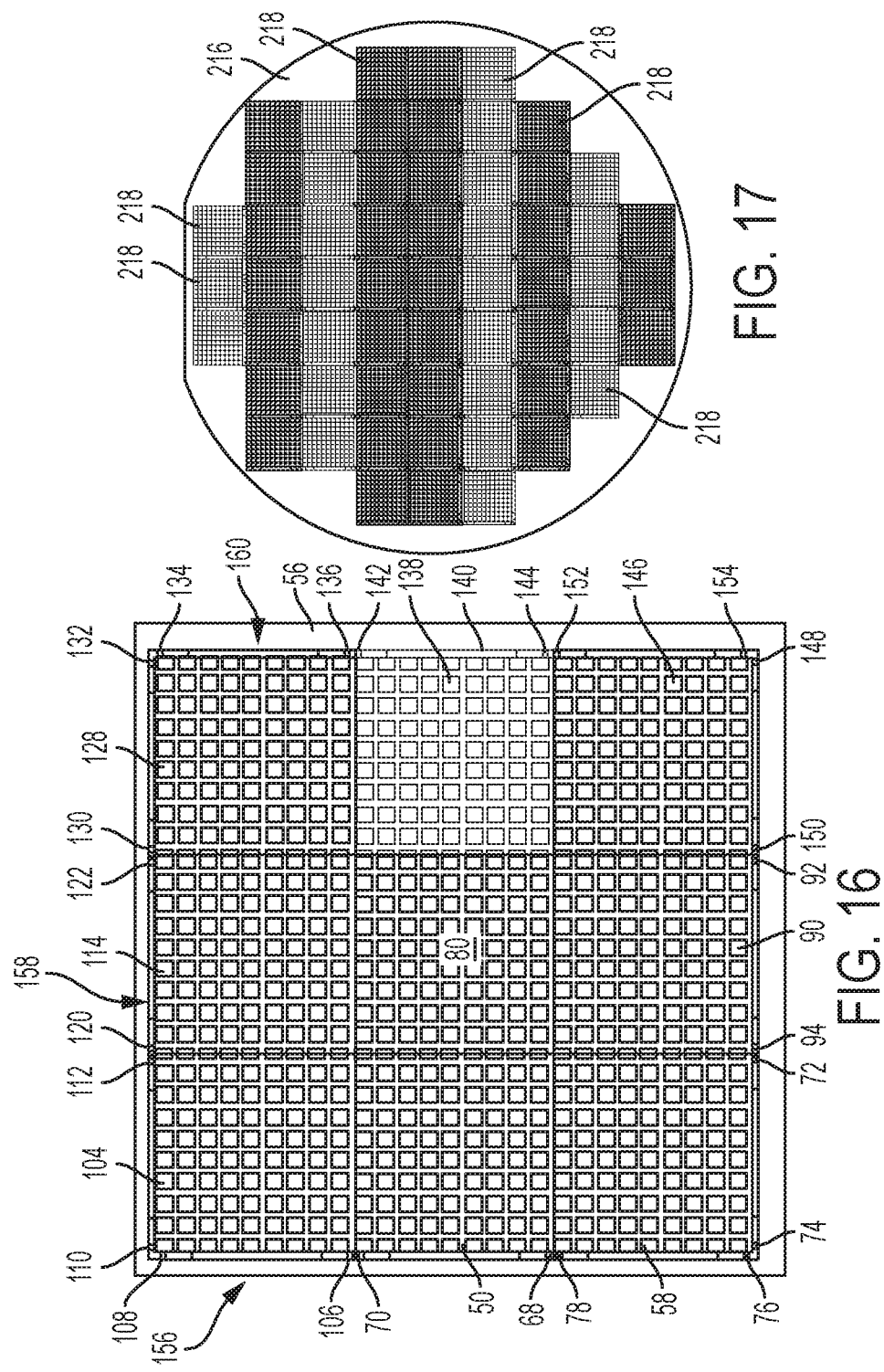

METHOD OF FORMING TWO-DIMENSIONAL AND THREE-DIMENSIONAL SEMICONDUCTOR CHIP ARRAYS

TECHNICAL FIELD

The presently disclosed embodiments are directed to providing a method of forming semiconductor chip arrays, more particularly to providing a method of forming two-dimensional and three-dimensional semiconductor arrays, and even more particularly to providing a method of forming two-dimensional and three-dimensional semiconductor arrays which incorporates a dicing step to remove a sacrificial edge after bonding.

BACKGROUND

Some known full width arrays (FWA) have a common pixel density spanning across multiple chips in a single dimension or direction. Formation of such FWAs involves a process of using chips where pixel-to-edge distance is minimal, e.g., less than 4 microns, in the one dimension array plane, followed by using "active" die alignment/placement with minimal chip gap, typically ranging from 2-8 microns. The foregoing technique decreases reliance on wafer yield.

Some conventional methods for forming a two-dimensional (2D) image array include using a single chip, e.g., fabricated in a single lithographic process, and in some cases for very large arrays, a single chip is formed per wafer. See for example, sensor array 40 on wafer 42 depicted in FIG. 1. Some of these methods lead to the need for larger diameter wafers, so that higher resolution is obtainable. These methods result in very few chips formed per wafer, e.g., sometimes as few as one chip per wafer. Unfortunately, defects on a wafer may lead to scrapped chips, and in some circumstances, results in scrapping an entire wafer.

Conventional dicing and die placement methods, i.e., when chips are placed next to each other, often results in inconsistencies in the distance between pixels at the ends or edges of the chips. These inconsistencies create spaces and/or gaps in an image captured with such chip arrays that must be filled in, i.e., corrected for, using computer software. Moreover, some information could be lost in these gaps.

In other assemblies, chips are stacked on top of each other or positioned relative to a board resulting in large gaps therebetween. Tolerances of board alignment, die bonding alignment and dicing accuracy can collectively result in large gaps. The foregoing circumstances cause tolerance issues that do not allow many chips to be placed close together without unacceptable gap sizes.

The present disclosure addresses a system and method for forming large area arrays without increased material scrap rates, thereby minimizing costs associated with forming the same.

SUMMARY

According to aspects illustrated herein, there is provided a method of fabricating an array of a plurality of sensor chips on a substrate. The method including: forming a first sensor chip of the plurality of sensor chips, the first sensor chip including a first sacrificial edge and a second sacrificial edge, each of the first and second sacrificial edges has a first fiducial and a second fiducial; bonding the first sensor chip to the substrate; forming a second sensor chip of the plurality of sensor chips, the second sensor chip including a third sacrificial edge and a fourth sacrificial edge, each of the third and fourth sacrificial edges has a first fiducial and a second fiducial; performing at least one of the following steps of aligning: aligning at least one of the first and second fiducials of the first sacrificial edge with at least one of the first second fiducials of the fourth sacrificial edge; and, aligning at least one of the first and second fiducials of the second sacrificial edge with at least one of the first second fiducials of the third sacrificial edge; and, bonding the second sensor chip to the substrate.

According to other aspects illustrated herein, there is provided a sensor chip formed from a plurality of sensor chips fabricated on a wafer. The wafer including a top surface, a bottom surface opposite the top surface and a thickness between the top and bottom surfaces. The sensor chip includes an active area formed on the top surface, a first sacrificial edge and a first score line. The first sacrificial edge includes a first fiducial and a second fiducial. The first score line is formed in a first portion of the thickness on the top surface between the first sacrificial edge and the active area.

According to still other aspects illustrated herein, there is provided a method for forming a sensor chip for attachment on a substrate. The sensor chip includes a top surface, a bottom surface opposite the top surface, a thickness between the top and bottom surfaces, an active area formed the top surface, and a first sacrificial edge including a first fiducial and a second fiducial arranged on the top surface adjacent to the active area. The method including: forming a first score line in a first portion of the thickness on the top surface between the first sacrificial edge and the active area; bonding the sensor chip to the substrate; forming a first cut line in a first portion of the thickness on the bottom surface between the first sacrificial edge and the active area, a combination of the first portion of the thickness on the top surface and the first portion of the thickness on the bottom surface is equal to the thickness; and, removing the first sacrificial edge.

Other objects, features and advantages of one or more embodiments will be readily appreciable from the following detailed description and from the accompanying drawings and claims.

BRIEF DESCRIPTION OF THE DRAWINGS

Various embodiments are disclosed, by way of example only, with reference to the accompanying drawings in which corresponding reference symbols indicate corresponding parts, in which:

FIG. 10 is a top plan view of an embodiment of five sensor chips after alignment and bonding to a substrate having a sixth sensor chip being aligned to the five sensor chip array, wherein the sixth sensor chip comprises two adjacent outer regions with each outer region comprising two fiducials;

FIG. 11 is a top plan view of an embodiment of six sensor chips after alignment and bonding to a substrate, each corner sensor chip comprising two adjacent outer regions, each outer region comprising two fiducials and each inner sensor chip comprising a single outer region comprising two fiducials;

FIG. 16 is a top plan view of an embodiment of nine sensor chips after alignment and bonding to a substrate, each corner sensor chip comprising two adjacent outer regions, each outer region comprising two fiducials, each inner sensor chip comprising a single outer region comprising two fiducials and a middle sensor chip having no outer region;

FIG. 17 is a top plan view of a silicon wafer having a plurality of sensor chips fabricated thereon;

DETAILED DESCRIPTION

Figure 1:
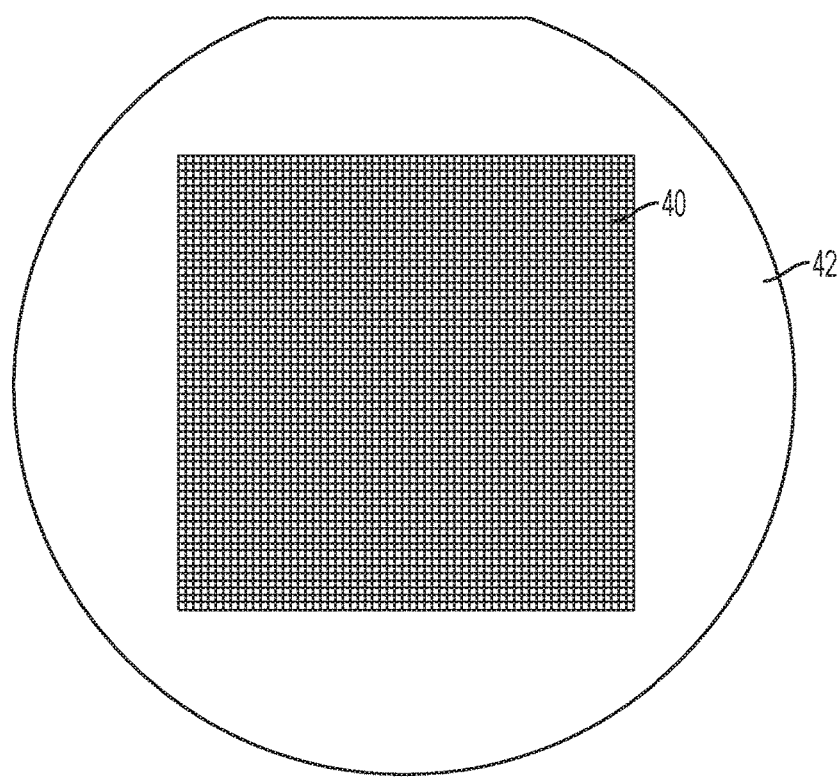
FIG. 1 is a top plan view of a known silicon wafer having a single large area array fabricated thereon.
Figure 2:
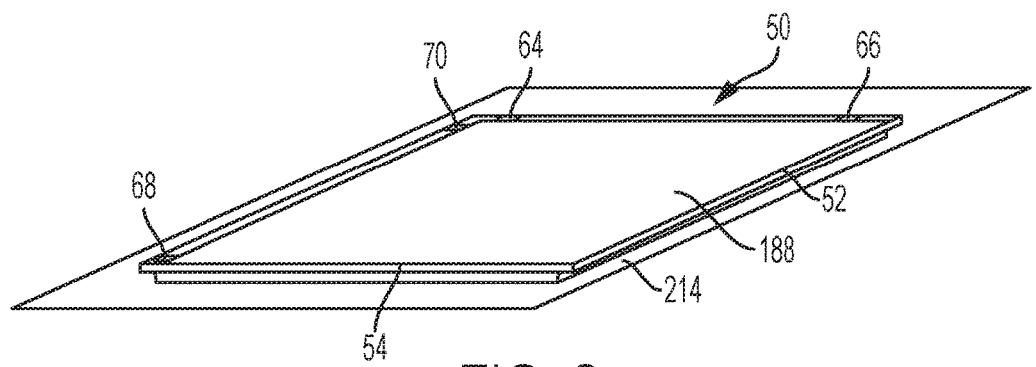
FIG. 2 is a perspective view of an embodiment of a single sensor comprising two adjacent outer regions, each outer region comprising two fiducials.
Figure 3:
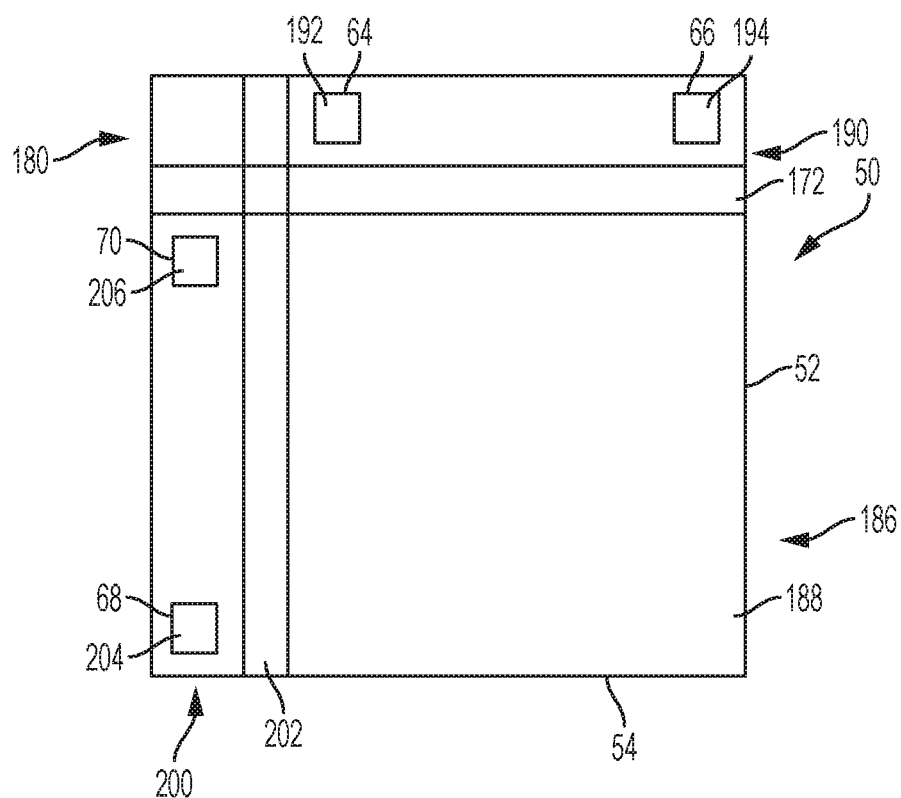
FIG. 3 is a top plan view of an embodiment of a single sensor chip comprising two adjacent outer regions, each outer region comprising two fiducials.
Figure 4:
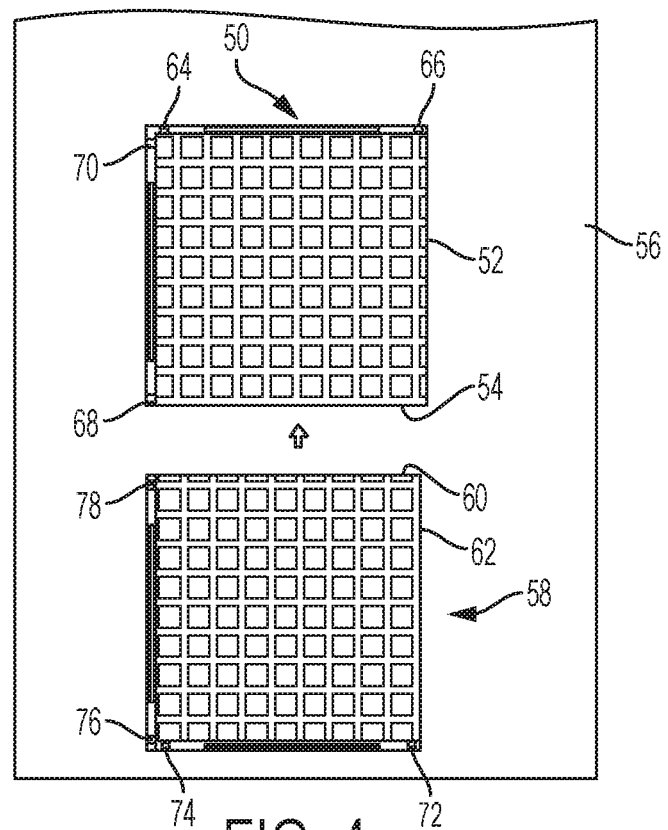
FIG. 4 is a top plan view of an embodiment of two sensor chips during alignment, each sensor chip comprising two adjacent outer regions, each outer region comprising two fiducials.
Figure 5:
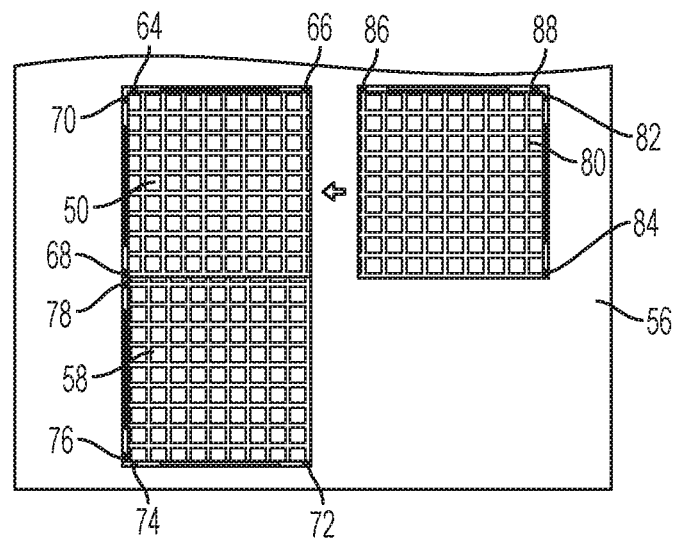
FIG. 5 is a top plan view of an embodiment of three sensor chips during alignment, each sensor chip comprising two adjacent outer regions, each outer region comprising two fiducials.
Figure 6:
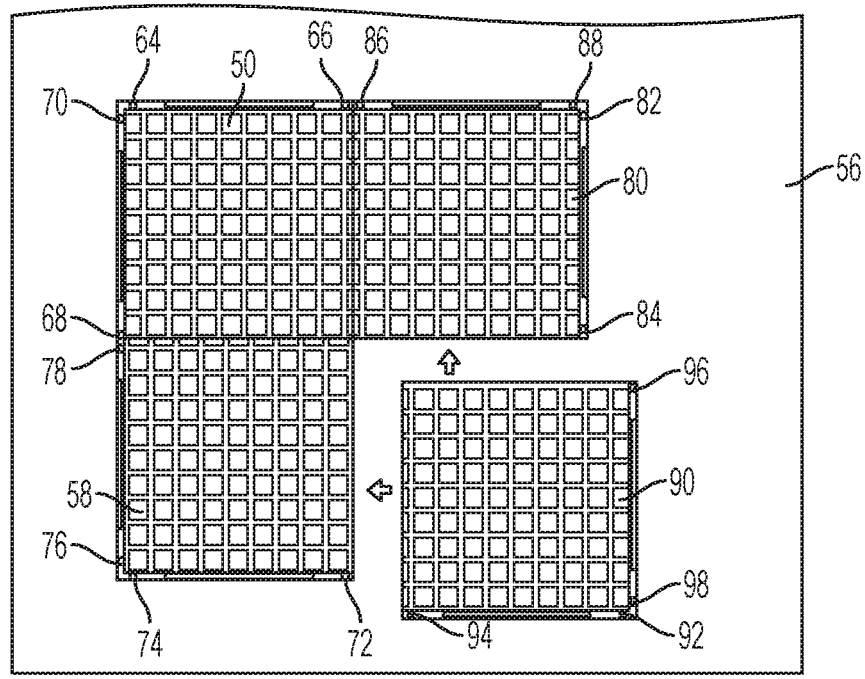
FIG. 6 is a top plan view of an embodiment of four sensor chips during alignment, each sensor chip comprising two adjacent outer regions, each outer region comprising two fiducials.
Figure 7:
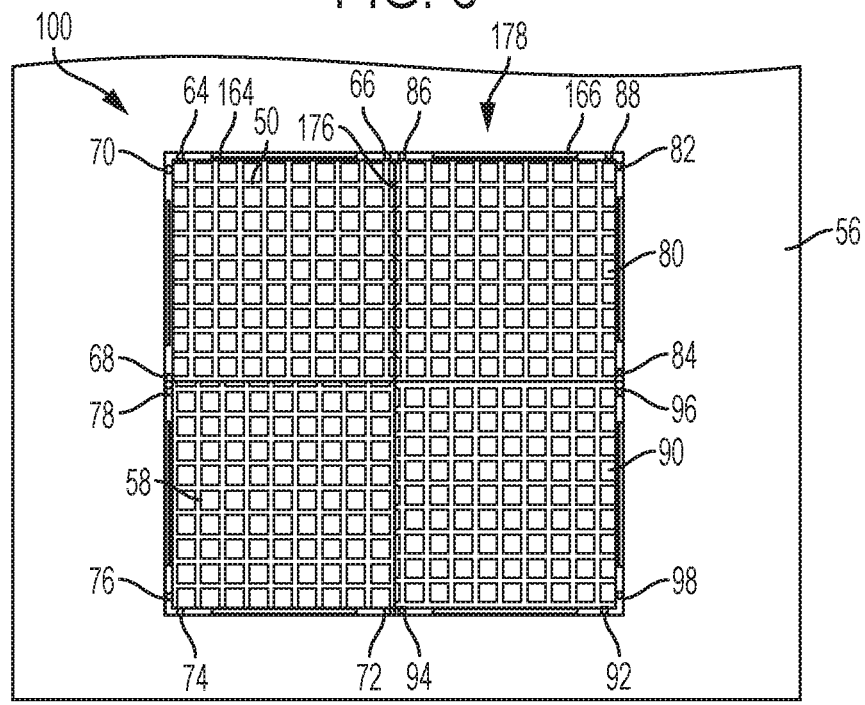
FIG. 7 is a top plan view of an embodiment of four sensor chips after alignment and bonding to a substrate, each sensor chip comprising two adjacent outer regions, each outer region comprising two fiducials.
Figure 9:
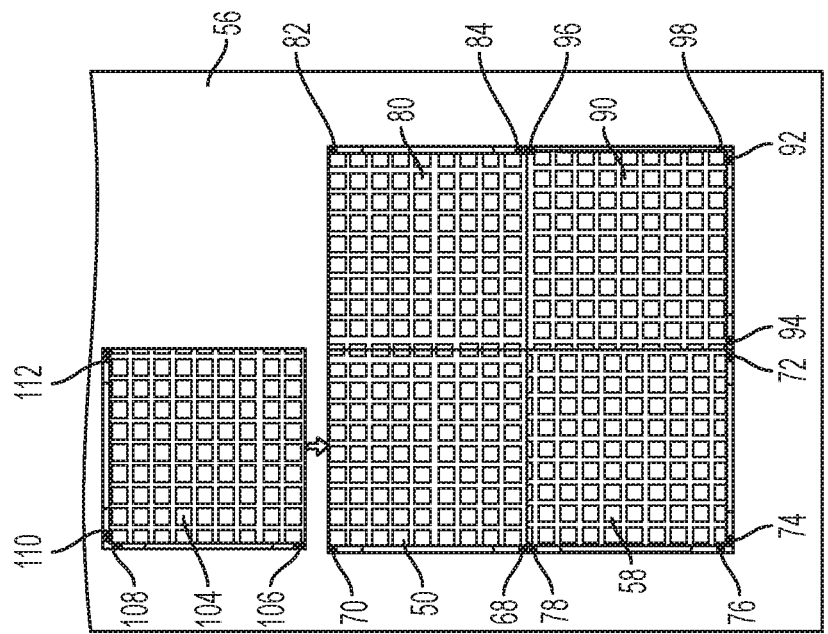
FIG. 9 is a top plan view of an embodiment of four sensor chips after alignment, bonding to a substrate and removal of one of the four outer edges having a fifth sensor chip being aligned to the four sensor chip array, wherein the fifth sensor chip comprises two adjacent outer regions with each outer region comprising two fiducials.
Figure 8:
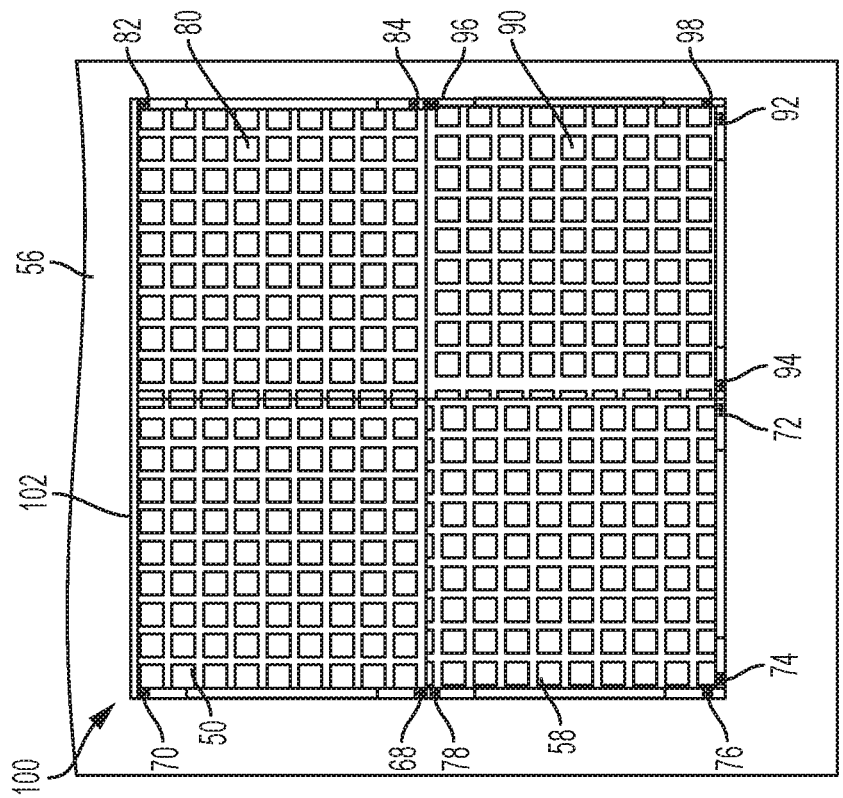
FIG. 8 is a top plan view of an embodiment of four sensor chips after alignment and bonding to a substrate, each sensor chip comprising two adjacent outer regions, each outer region comprising two fiducials, wherein one of the four outer edges has been removed for further assembly.
Figure 13:
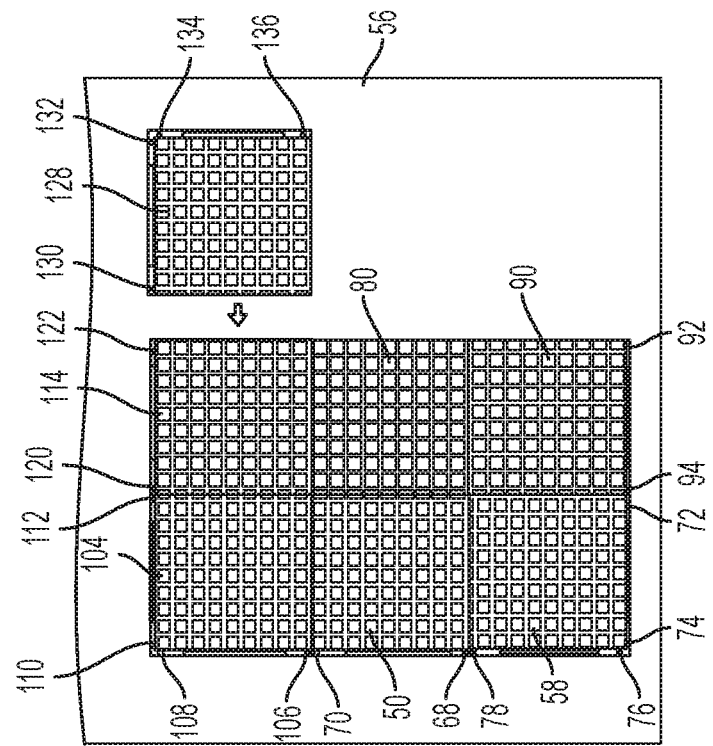
FIG. 13 is a top plan view of an embodiment of six sensor chips after alignment, bonding to a substrate and removal of one of the four outer edges having a seventh sensor chip being aligned to the six sensor chip array, wherein the seventh sensor chip comprises two adjacent outer regions, each outer region comprising two fiducials.
Figure 12:
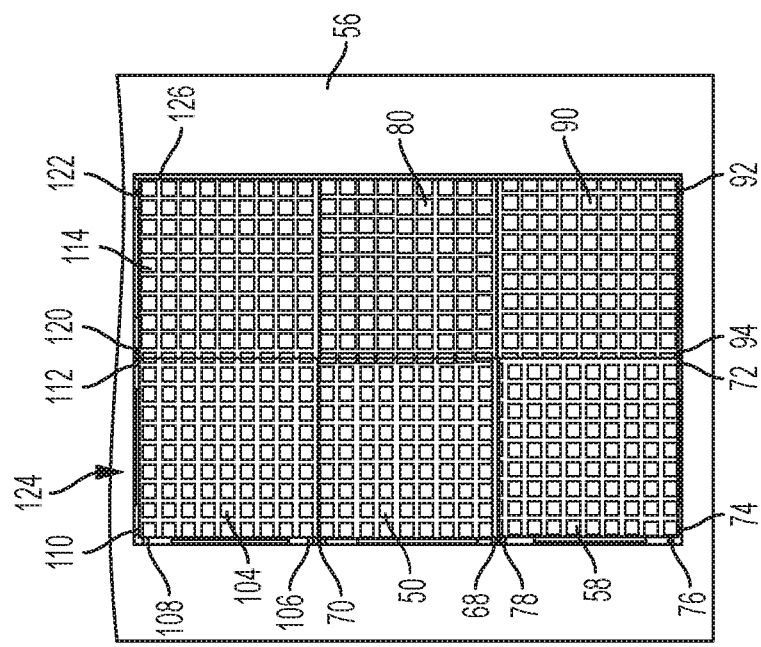
FIG. 12 is a top plan view of an embodiment of six sensor chips after alignment and bonding to a substrate, each corner sensor chip comprising two adjacent outer regions, each outer region comprising two fiducials and each inner sensor chip comprising a single outer region comprising two fiducials, wherein one of the four outer edges has been removed for further assembly.
Figure 15:
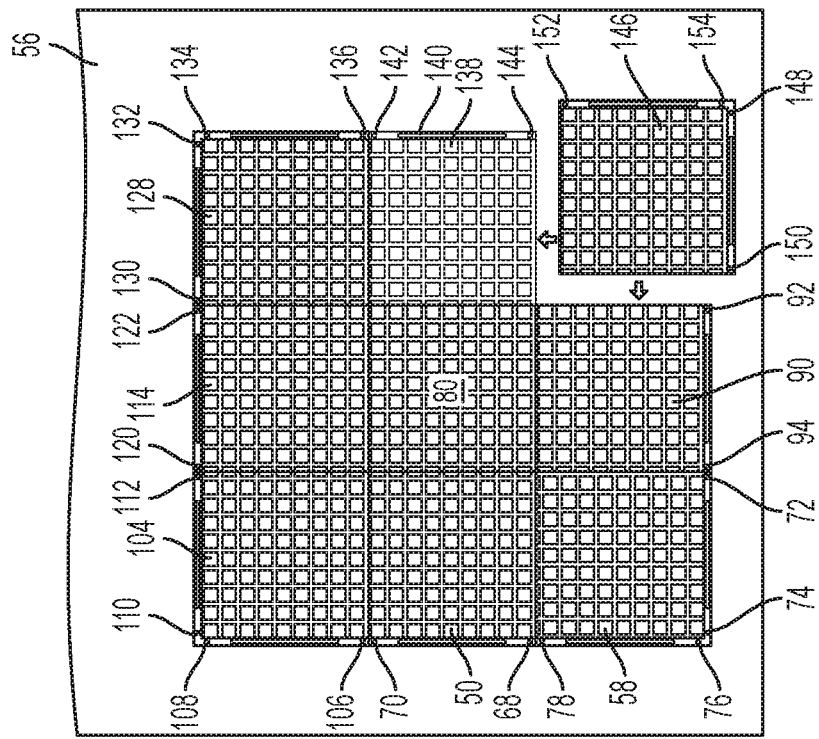
FIG. 15 is a top plan view of an embodiment of eight sensor chips after alignment and bonding to a substrate having a ninth sensor chip being aligned to the eight sensor chip array, wherein the ninth sensor chip comprises two adjacent outer regions, each outer region comprising two fiducials.
Figure 14:
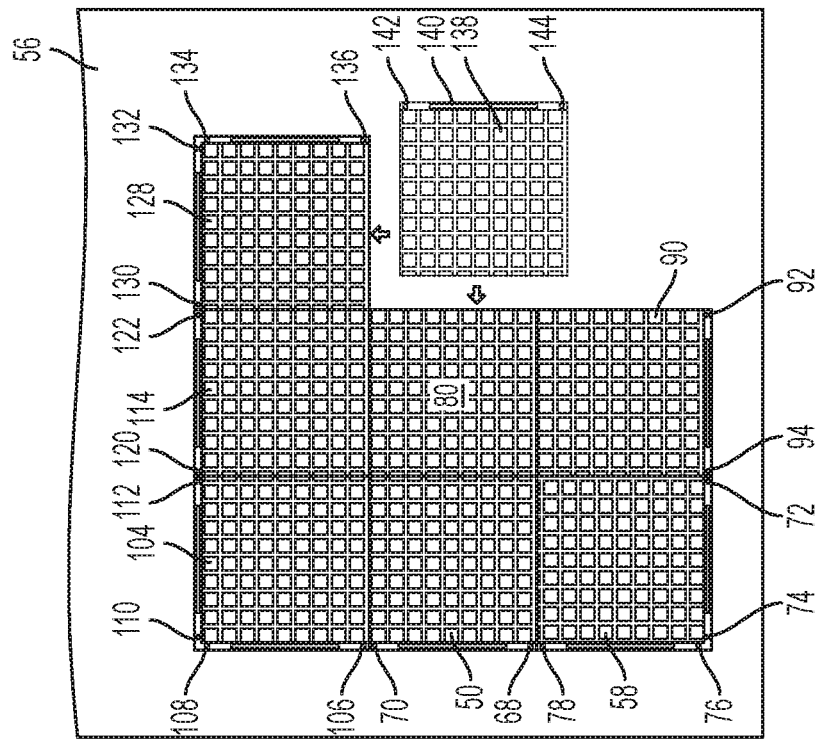
FIG. 14 is a top plan view of an embodiment of seven sensor chips after alignment and bonding to a substrate having an eighth sensor chip being aligned to the seven sensor chip array, wherein the eighth sensor chip comprises a single outer region comprising two fiducials.

At the outset, it should be appreciated that like drawing numbers on different drawing views identify identical, or functionally similar, structural elements of the embodiments set forth herein. Furthermore, it is understood that these embodiments are not limited to the particular methodologies, materials and modifications described and as such may, of course, vary. It is also understood that the terminology used herein is for the purpose of describing particular aspects only, and is not intended to limit the scope of the disclosed embodiments, which are limited only by the appended claims.

Unless defined otherwise, all technical and scientific terms used herein have the same meaning as commonly understood to one of ordinary skill in the art to which these embodiments belong. As used herein, "fiducial" and "fiducial mark" should be construed broadly to include any marking, e.g., cross hairs, bulls eye, points, line, mark, portion of an impression, etc., used to designate a position on a printed image.

As used herein, the term 'average' shall be construed broadly to include any calculation in which a result datum or decision is obtained based on a plurality of input data, which can include but is not limited to, weighted averages, yes or no decisions based on rolling inputs, etc. Furthermore, it should be appreciated that "about" is intended to mean a value within 10% of the value associated with the term. For example, a thickness which is about 10 millimeters (mm) ranges between 9 mm and 11 mm.

Furthermore, as used herein, "and/or" is intended to mean a grammatical conjunction used to indicate that one or more of the elements or conditions recited may be included or occur. For example, a device comprising a first element, a second element and/or a third element, is intended to be construed as any one of the following structural arrangements: a device comprising a first element; a device comprising a second element; a device comprising a third element; a device comprising a first element and a second element; a device comprising a first element and a third element; a device comprising a first element, a second element and a third element; or, a device comprising a second element and a third element.

Moreover, although any methods, devices or materials similar or equivalent to those described herein can be used in the practice or testing of these embodiments, some embodiments of methods, devices, and materials are now described.

The instant disclosure proposes a process that uses similar technology as described above relative to a one dimensional array to build a two dimensional array without a loss in pixel density in either the X or Y plane. The instant process is performed using chips where pixel-to-edge distance is minimal in both X and Y planes, and utilizes a bond-then-dice approach that allows for a systematic formation of two dimensional arrays without any gaps in either plane. The presently disclosed bond-then-dice process utilizes a recess cut on the backside of the wafer corresponding to a previously formed topside cut.

Known active placement die bonding is currently performed in one dimension. The chip-edges perpendicular to the array plane are diced with an extremely tight tolerance so that there is minimal distance from the pixel edge to the chip-edge. Alignment marks, also known as fiducials, are located on the chips to facilitate alignment of each chip relative to the other chips, but not relative to the board or substrate on which the chips are bonded. The fiducials also allow the space between semiconductor chips to be controlled. The present process uses chips with a tight tolerance of pixel edge to chip-edge distance in multiple planes and uses a bond-then-dice process with active alignment at the array fabrication level.

The following describes an embodiment of the present process for what is referred to herein as bond-then-dice. The following is best understood in view of FIGS. 2-19. It should be appreciated that each chip, e.g., sensor or emitter, placed and bonded includes either two or three diced and trimmed edges depending on when within the process the respective chip is used. Adjacent edges are removes in each instance where two edges are diced and trimmed.

First chip 50, having edges 52 and 54 previously diced and trimmed, is aligned relative to board/substrate 56 and then placed. Second chip 58, having edges 60 and 62 previously diced and trimmed, is then rotated ninety degrees (90°) and aligned to first chip 50 using "active alignment" of fiducials 64, 66, 68 and 70 on first chip 50 and fiducials 72, 74, 76 and 78 on second chip 58. Thus, second chip 58 has a set of alignment marks, i.e., fiducials 72 and 74, aligned to a set of alignment marks on first chip 50, i.e., fiducials 64 and 66, and another set of alignment marks, i.e., fiducials 76 and 78, across from the second set of alignment marks on first chip 50, i.e., fiducials 68 and 70.

Third chip 80 is then rotated negative ninety degrees (−90°) and placed relative to first chip 50 using active alignment, similarly as described with respect to the alignment of first chip 50 and second chip 58. Third chip 80 has a set of alignment marks, i.e., fiducials 82 and 84, aligned to a set of alignment marks on first chip 50, i.e., fiducials 68 and 70, and another set of alignment marks, i.e., fiducials 86 and 88, across from a set of alignment marks on first chip 50, i.e., fiducials 64 and 66. Fourth chip 90 is rotated one hundred eighty degrees (180°) and placed relative to second and third chips 58 and 80, respectively, using active alignment, similarly as described with respect to the alignment of first chip 50 and second chip 58. Thus, fiducials 92 and 94 of fourth chip 90 may be aligned to fiducials 72 and 74 of second chip 58 and fiducials 86 and 88 of third chip 80. Similarly, fiducials 96 and 98 of fourth chip 90 may be aligned to fiducials 76 and 78 of second chip 58 and fiducials 82 and 84 of third chip 80. The foregoing steps create a two-by-two (2×2) array of chips, i.e., array 100. It should be appreciated that alignment marks are used to align in the X, Y and θ directions.

After the foregoing process is complete, some or all of the alignment marks may then be removed using a dicing process. In embodiments where an array larger than 2×2 is being formed, some of the alignment marks must remain. For example, edge 102, which includes fiducials 64 and 66 on first chip 50 and fiducials 86 and 88 on third chip 80, is removed using a dicing process. The removal of edge 102 permits the placement of two additional chips. Fifth chip 104 is placed relative to first and second chips 50 and 58, respectively. Fiducials 106 and 108 on fifth chip 104 may be aligned to fiducials 68 and 70 of first chip 50 and fiducials 76 and 78 of second chip 58, while fiducials 110 and 112 of fifth chip 104 may be aligned to fiducials 72 and 74 of second chip 58. Next, sixth chip 114 is placed relative to third, fourth and fifth chips 80, 90 and 104, respectively. Fiducials 116 and 118 on sixth chip 114 may be aligned to fiducials 106 and 108 of fifth chip 104, fiducials 82 and 84 of third chip 80 and fiducials 96 and 98 of fourth chip 90. Similarly, fiducials 120 and 122 of sixth chip 114 may be aligned to fiducials 110 and 112 of fifth chip 104 and fiducials 92 and 94 of fourth chip 90. The foregoing process places two more chips forming a 2×3 array, i.e., array 124.

Subsequently, additional edges may be removed in order to facilitate the placement of additional chips, e.g., to form a 3×3 array. In some embodiments, edge 126 of array 124 may be removed, which results in the removal of fiducials 116 and 118 from sixth chip 114, fiducials 82 and 84 from third chip 80 and fiducials 96 and 98 from fourth chip 90. Seventh chip 128 is placed relative to fifth and sixth chips 104 and 114, respectively. Fiducials 130 and 132 on seventh chip 128 may be aligned to fiducials 110 and 112 of fifth chip 104 and fiducials 120 and 122 of sixth chip 114, while fiducials 134 and 136 of seventh chip 128 may be aligned to fiducials 106 and 108 of fifth chip 104. Then, eighth chip 138 is placed relative to first and seventh chips 50 and 128, respectively. As eighth chip 138 is a "middle chip", i.e., a chip being positioned between two other chips, three of the four edges of eighth chip 138 must be removed prior to placement. Thus, eighth chip 138 includes edge 140 having fiducials 142 and 144 arranged thereon. Fiducials 142 and 144 on eighth chip 138 may be aligned to fiducials 68 and 70 of first chip 50 and fiducials 134 and 136 of seventh chip 128. Next, ninth chip 146 is placed relative to second, fourth, seventh and eighth chips 58, 90, 128 and 138, respectively. Fiducials 148 and 150 on ninth chip 146 may be aligned to fiducials 72 and 74 of second chip 58 and fiducials 92 and 94 of fourth chip 90, while fiducials 152 and 154 on ninth chip 146 may be aligned to fiducials 76 and 78 of second chip 58, fiducials 134 and 136 of seventh chip 128 and fiducials 142 and 144 of eighth chip 138. The foregoing process places three more chips forming a 3×3 array, i.e., chip array 156.

Figure 18:
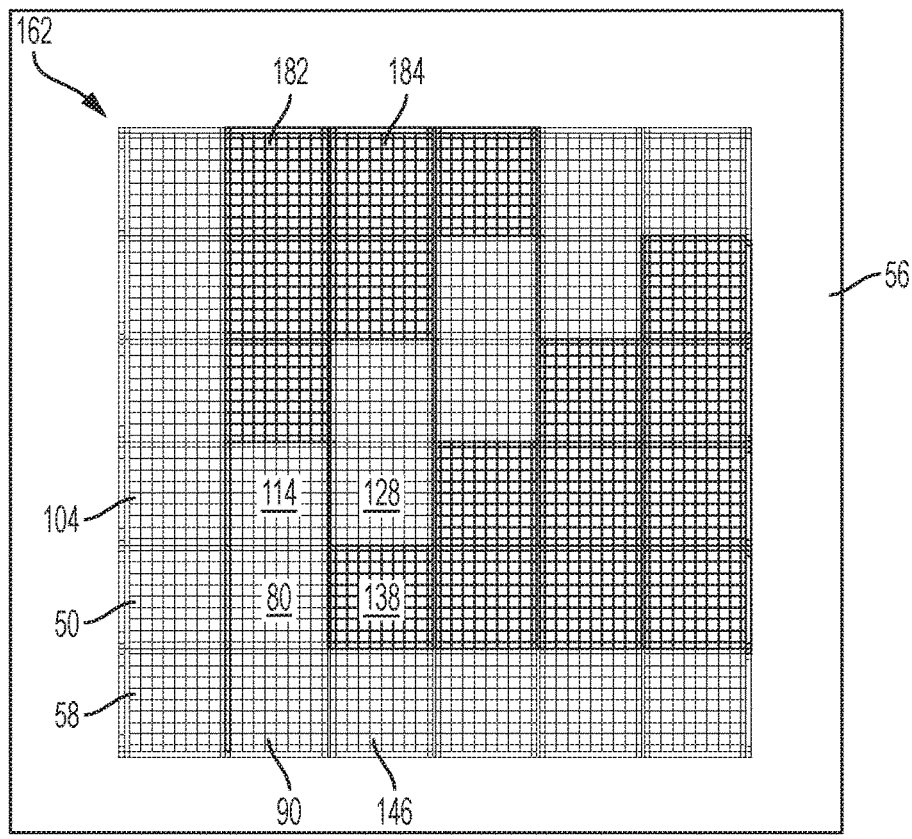
FIG. 18 is a top plan view of an embodiment of thirty six sensor chips after alignment and bonding to a substrate, wherein each sensor chip is designated to indicate whether two adjacent outer regions or a single outer region where present on the sensor chip during assembly; and, FIG. 19 is a cross sectional view of adjacent sensor chips depicting a score line formed on a top surface and a bevel formed in a bottom surface to facilitate accurate dicing of edges of the sensor chip.
Figure 19:
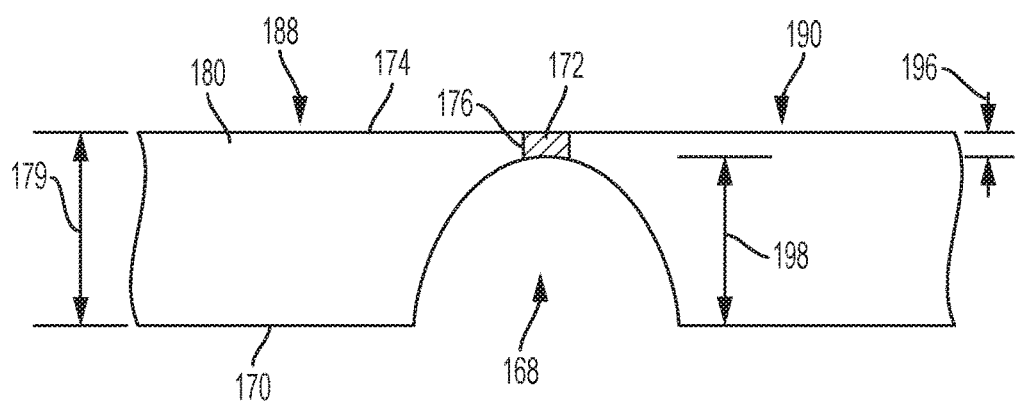

It should be appreciated that the process described above may be repeated as many times as necessary to result in an array of a particular size, i.e., m×n or n×n. For example, edge 158 or edge 160 may be removed from 3×3 array 156 thereby permitting the attachment of three additional chips to result in a 3×4 array. Next, an edge along a long edge of the 3×4 array many removed thereby permitting attachment of four additional chips to result in a 4×4 array. The foregoing may be repeated as many times as necessary. For example, array 162, depicted in FIG. 18, is a 6×6 array. Larger arrays may be formed by repeating the process additional times.

For components with bottom side electrical connections, array 100 can be expanded many more times. Once a 2×2 array is completed, a dicing step is required. The dicing step removes the alignment marks on one side of the 2×2 array, e.g., fiducials 64 and 66 from first chip 50 and fiducials 86 and 88 from third chip 80, and trims the chip edges, e.g., chip edges 164 and 166, similar to the dicing method used at the wafer level.

To enable a bond-then-dice process, chips should have recess 168 on backside or back surface 170 corresponding to cut 172 in topside or top surface 174. Once recess 168 is formed, a new plane/edge with minimal pixel-to-edge distance is created, e.g., edge 176. Edge 176 allows for a new column of chips, e.g., column 178, to be placed tightly and maintain correct pixel density, i.e., without unnecessary gaps or voids. It has been found that accurately formed edges may be cut by first scoring or cutting lines 176 first on top surface 174. Thickness 179 of wafer 180 permits increased control of forming the top surface cut and ensures minimum movement. Thus, all critical cuts are made while the silicon wafer is still solid and in its most rigid form. Top surface cuts made up to approximately 30% into the total thickness of wafer 180 are preferred; however, deeper cuts are also possible. Subsequently, bottom surface 170 is cut towards the cut in top surface 174. As the two cuts meet, edge 176 is removed from wafer 180. The bottom surface cuts, which are less accurate, are made after the top surface cuts thereby minimizing any negative impacts from the bottom surface cuts. The foregoing method has been found to minimize movement when performing the final cut from the bottom surface.

The foregoing bond-then-dice process can be repeated for additional edges to create an n by n (n×n) array. It should be noted that as the array grows in area, "middle chips" will need to be diced so that there is only one edge with fiducials and three edges with tight pixel-to-edge accuracy, e.g., middle chip 138, 182, 184, etc. The larger the array area becomes, the greater the number of "middle chips" that are required. See, for example, the middle chips included in array 162.

In some embodiments, a sensor array, e.g., sensor chip 186, is formed from a plurality of sensor chips 186 fabricated on wafer 180. Wafer 180 comprises top surface 174, bottom surface 170 opposite top surface 174 and thickness 179 between top and bottom surfaces 174 and 170, respectively. Sensor chip 186 comprises active area 188 formed on top surface 174, sacrificial edge 190 and score line 172. Sacrificial edge 190 comprises first fiducial 192 and second fiducial 194, respectively. Score line 172 is formed in portion 196 of thickness 179 on top surface 174 between sacrificial edge 190 and active area 188. In some embodiments, portion 196 is less than or equal to about thirty percent of thickness 179. In some embodiments, sensor chip 186 further comprises cut line 168 formed in portion 198 of thickness 179 on bottom surface 170 between sacrificial edge 190 and active area 188. In some embodiments, a combination of portion 196 and portion 198 is equal to thickness 179.

In some embodiments, sensor chip 186 further comprises sacrificial edge 200 and score line 202. Sacrificial edge 200 comprises first fiducial 204 and second fiducial 206, and is arranged adjacent to sacrificial edge 190. Score line 202 is formed in a portion, e.g., a portion similar to portion 196, of thickness 179 on top surface 174 between sacrificial edge 200 and active area 188. In some embodiments, each of portion in top surface 174, e.g., portion 196, is less than or equal to about thirty percent of thickness 179. In some embodiments, sensor chip 186 further comprises cut lines corresponding to each score line, e.g., cut line 168. Cut line 168 is formed in portion 198 of thickness 179 on bottom surface 170 between sacrificial edge 190 and active area 188. Each cut line is formed in a portion of thickness 179 on bottom surface 170 between, for example, sacrificial edge 200 and active area 188. In some embodiments, each of the combinations of portions cut in top surface 174, e.g., portion 196, and in bottom surface 170, e.g., portion 208, is equal to thickness 179.

In some embodiments, the present method broadly includes a method of forming sensor chip 186 for attachment on substrate 214. Sensor chip 186 comprises top surface 174, bottom surface 170 opposite top surface 174, thickness 179 between top and bottom surfaces 174 and 170, respectively, active area 188 formed on the top surface, and a first sacrificial edge comprising a first fiducial and a second fiducial arranged on top surface 174 adjacent to active area 188. The method comprises: forming score line 172 in portion 196 of thickness 179 on top surface 174 between sacrificial edge 190 and active area 188; bonding sensor chip 186 to substrate 214; forming cut line 168 in portion 198 of thickness 179 on bottom surface 170 between sacrificial edge 190 and active area 188, a combination of portion 196 and 198 is equal to thickness 179; and, removing sacrificial edge 190. In some embodiments, sensor chip 186 further comprises sacrificial edge 200 comprising first fiducial 204 and second fiducial 206 arranged on top surface 174 adjacent to active area 188 and sacrificial edge 190. In those embodiments, the method further comprises: before the step of bonding, forming score line 202 in portion 208 of thickness 179 on top surface 174 between sacrificial edge 200 and active area 188. Moreover, in those embodiments, the method, after the step of bonding, further comprises: forming cut line 210 in portion 212 of thickness 179 on bottom surface 170 between sacrificial edge 200 and active area 188, a combination of portions 208 and 212 is equal to thickness 179; and, removing sacrificial edge 200.

Chip arrays formed by the present process can be used in many different 2D imaging arrays. The present bond-then-dice process minimizes the impact of wafer level defects, reducing the waste associated in producing high cost and/or large area imagers such as infrared and ultraviolet devices. Active placement die bonding uses alignment marks to align one chip to another placed before it. The foregoing takes out effects of chip placement relative to the board, thereby allowing the space between two semiconductor chips to be accurately controlled. Thus, a single wafer, e.g., wafer 216, can be fabricated with multiple sensor chips, e.g., chips 218, where the sensor chips are separated and then reformed into an array of chips, e.g., array 162.

The embodiments of the present process described above use die bonding technology to place multiple chips close together across a board. The present process uses active placement to accurately position the dies or chips relative to each other. In other embodiments, e.g., three dimensional (3D) arrays, when a 2D array is complete, a chip will then be placed on top of the formed 2D array. In such embodiments, each chip placed on the top surface of the formed 2D array includes a material on its bottom surface to prevent damaging the chips of the formed 2D array. The foregoing arrangement creates a dense 3D multichip array that can be treated as a single large array of chips, and allows for formation of an array that expands in the upward direction.

It should be appreciated that although the foregoing embodiments are described with respect to sensor chips, the various methods are also applicable to the formation of emitter arrays, e.g., large array light emitting diode arrays. Moreover, the foregoing methods may be used to form sub-assemblies, i.e., arrays used to form larger array assemblies at a later time. Furthermore, although the embodiments described above and depicted in the figures disclose a particular order to the assembly of sensor chips, it should be appreciated that the order disclosed is an example order and other orders may also be used, and such orders fall within the scope of the claims below.

The foregoing disclosure proposes a method of fabricating two-dimensional and three-dimensional arrays of tightly packed semiconductor chips. Alignment marks, e.g., fiducials, are located on two adjacent sides of each single chip to allow for alignment of each chip relative to the other chips already placed on a board. Once a 2×2 array is completed, a dicing step is performed to remove the alignment marks on one side of the 2×2 array which trims a chip's edge close to the chip's active area with the help of a backside recess corresponding to the topside cut. Formation of the array continues with the addition of two more chips along the dicing line followed by another dice/trim along a long side of the 2×3 array. Three chips are then added to this line with one of them being a chip with one set of fiducials already removed. The process is repeated until the array is the desired size. In addition to addressing yield concerns of single wafer large arrays, the presently disclosed process enables fabrication of image sensors much larger than the native wafer size used to fabricate the image sensor tile. Device and wafer yield is an exponential function, the larger the device, the lower the yield. Typical mature CMOS wafer yield can be 90% or more, but it is extremely rare to achieve 100% or even close. The present methods can reduce production costs. The present method allows rework to be performed as discrete sensor chips can be removed and replaced within a larger array of sensor chips. Moreover, the present method permits testing of each sensor chip prior to assembly into a larger array. Thus, defective sensor chips can be removed from the process prior to assembly.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims.

What is claimed is:

1. A method of fabricating an array of a plurality of sensor chips on a substrate, the method comprising:
    forming a first sensor chip of the plurality of sensor chips, the first sensor chip comprising a first sacrificial edge and a second sacrificial edge, each of the first and second sacrificial edges comprises a first fiducial and a second fiducial;
    bonding the first sensor chip to the substrate;
    forming a second sensor chip of the plurality of sensor chips, the second sensor chip comprising a third sacrificial edge and a fourth sacrificial edge, each of the third and fourth sacrificial edges comprises a first fiducial and a second fiducial;
    performing at least one of the following steps of aligning:
        aligning at least one of the first and second fiducials of the first sacrificial edge with at least one of the first second fiducials of the fourth sacrificial edge; and,
        aligning at least one of the first and second fiducials of the second sacrificial edge with at least one of the first second fiducials of the third sacrificial edge; and,
    bonding the second sensor chip to the substrate.

2. The method of claim 1 further comprising:
    forming a third sensor chip of the plurality of sensor chips, the third sensor chip comprising a fifth sacrificial edge and a sixth sacrificial edge, each of the fifth and sixth sacrificial edges comprises a first fiducial and a second fiducial;
    performing at least one of the following steps of aligning:
        aligning at least one of the first and second fiducials of the first sacrificial edge with at least one of the first second fiducials of the sixth sacrificial edge; and,
        aligning at least one of the first and second fiducials of the second sacrificial edge with at least one of the first second fiducials of the fifth sacrificial edge; and,
    bonding the third sensor chip to the substrate.

3. The method of claim 2 further comprising:
    forming a fourth sensor chip of the plurality of sensor chips, the fourth sensor chip comprising a seventh sacrificial edge and an eighth sacrificial edge, each of the seventh and eighth sacrificial edges comprises a first fiducial and a second fiducial;
    performing at least one of the following steps of aligning:
        aligning at least one of the first and second fiducials of the fourth sacrificial edge with at least one of the first second fiducials of the seventh sacrificial edge;
        aligning at least one of the first and second fiducials of the third sacrificial edge with at least one of the first second fiducials of the eighth sacrificial edge;
        aligning at least one of the first and second fiducials of the sixth sacrificial edge with at least one of the first second fiducials of the seventh sacrificial edge; and,
        aligning at least one of the first and second fiducials of the fifth sacrificial edge with at least one of the first second fiducials of the eighth sacrificial edge; and,
    bonding the fourth sensor chip to the substrate.

4. The method of claim 3 further comprising:
    removing the first and sixth sacrificial edges;
    forming a fifth sensor chip of the plurality of sensor chips, the fifth sensor chip comprising a ninth sacrificial edge and a tenth sacrificial edge, each of the ninth and tenth sacrificial edges comprises a first fiducial and a second fiducial;
    performing at least one of the following steps of aligning:
        aligning at least one of the first and second fiducials of the second sacrificial edge with at least one of the first second fiducials of the tenth sacrificial edge;
        aligning at least one of the first and second fiducials of the third sacrificial edge with at least one of the first second fiducials of the tenth sacrificial edge; and,
        aligning at least one of the first and second fiducials of the fourth sacrificial edge with at least one of the first second fiducials of the tenth sacrificial edge; and,
    bonding the fifth sensor chip to the substrate.

5. The method of claim 4 further comprising:
    forming a sixth sensor chip of the plurality of sensor chips, the sixth sensor chip comprising an eleventh sacrificial edge and a twelfth sacrificial edge, each of the eleventh and twelfth sacrificial edges comprises a first fiducial and a second fiducial;
    performing at least one of the following steps of aligning:
        aligning at least one of the first and second fiducials of the fifth sacrificial edge with at least one of the first second fiducials of the eleventh sacrificial edge;
        aligning at least one of the first and second fiducials of the eighth sacrificial edge with at least one of the first second fiducials of the eleventh sacrificial edge;
        aligning at least one of the first and second fiducials of the tenth sacrificial edge with at least one of the first second fiducials of the eleventh sacrificial edge;
        aligning at least one of the first and second fiducials of the seventh sacrificial edge with at least one of the first second fiducials of the twelfth sacrificial edge; and,
        aligning at least one of the first and second fiducials of the ninth sacrificial edge with at least one of the first second fiducials of the twelfth sacrificial edge; and,
    bonding the sixth sensor chip to the substrate.

6. The method of claim 5 further comprising:
    removing the fifth, eighth and eleventh sacrificial edges;
    forming a seventh sensor chip of the plurality of sensor chips, the seventh sensor chip comprising a thirteenth sacrificial edge and a fourteenth sacrificial edge, each of the thirteenth and fourteenth sacrificial edges comprises a first fiducial and a second fiducial;
    performing at least one of the following steps of aligning:

aligning at least one of the first and second fiducials of the tenth sacrificial edge with at least one of the first second fiducials of the thirteenth sacrificial edge;

aligning at least one of the first and second fiducials of the ninth sacrificial edge with at least one of the first second fiducials of the fourteenth sacrificial edge; and, aligning at least one of the first and second fiducials of the twelfth sacrificial edge with at least one of the first second fiducials of the fourteenth sacrificial edge; and, bonding the seventh sensor chip to the substrate.

7. The method of claim 6 further comprising:

forming a eighth sensor chip of the plurality of sensor chips, the eighth sensor chip comprising a fifteenth sacrificial edge comprising a first fiducial and a second fiducial;

performing at least one of the following steps of aligning:

aligning at least one of the first and second fiducials of the second sacrificial edge with at least one of the first second fiducials of the fifteenth sacrificial edge; and, aligning at least one of the first and second fiducials of the thirteenth sacrificial edge with at least one of the first second fiducials of the fifteenth sacrificial edge; and, bonding the eighth sensor chip to the substrate.

8. The method of claim 7 further comprising:

forming a ninth sensor chip of the plurality of sensor chips, the ninth sensor chip comprising a sixteenth sacrificial edge and a seventeenth sacrificial edge, each of the sixteenth and seventeenth sacrificial edges comprises a first fiducial and a second fiducial;

performing at least one of the following steps of aligning:

aligning at least one of the first and second fiducials of the fourth sacrificial edge with at least one of the first second fiducials of the sixteenth sacrificial edge;

aligning at least one of the first and second fiducials of the seventh sacrificial edge with at least one of the first second fiducials of the sixteenth sacrificial edge;

aligning at least one of the first and second fiducials of the fourteenth sacrificial edge with at least one of the first second fiducials of the sixteenth sacrificial edge;

aligning at least one of the first and second fiducials of the third sacrificial edge with at least one of the first second fiducials of the seventeenth sacrificial edge;

aligning at least one of the first and second fiducials of the thirteenth sacrificial edge with at least one of the first second fiducials of the seventeenth sacrificial edge; and, aligning at least one of the first and second fiducials of the fifteenth sacrificial edge with at least one of the first second fiducials of the seventeenth sacrificial edge; and, bonding the ninth sensor chip to the substrate.

9. The method of claim 8 wherein each of the first, second, third, fourth, fifth, sixth, seventh, eighth and ninth sensor chips comprises:

a top surface;

a bottom surface opposite the top surface;

a thickness between the top surface and the bottom surface; and, a score line adjacent to each sacrificial edge of each respective sensor chip.

10. The method of claim 1 wherein each of the first and the second sensor chips comprises:

a top surface;

a bottom surface opposite the top surface;

a thickness between the top surface and the bottom surface; and, a score line adjacent to each sacrificial edge of each respective sensor chip.

* * * * *